(12) United States Patent
Aylaian (10) Patent No.: US 7,208,674 B2
(45) Date of Patent: Apr. 24, 2007

(54) SOLAR CELL HAVING PHOTOVOLTAIC CELLS INCLINED AT ACUTE ANGLE TO EACH OTHER

(76) Inventor: Eric Aylaian, 1030 Mary Ann Dr., Santa Clara, CA (US) 95050

( * ) Notice: Subject to any disclaimer, the term of this patent is extended or adjusted under 35 U.S.C. 154(b) by 534 days.

(21) Appl. No.: 10/241,806

(22) Filed: Sep. 10, 2002

(65) Prior Publication Data

US 2003/0047207 A1    Mar. 13, 2003

(51) Int. Cl.
*H01L 31/042*    (2006.01)
*H01L 31/00*    (2006.01)
*H01L 31/0203*    (2006.01)

(52) U.S. Cl. .............. 136/251; 136/244; 136/259; 257/433

(58) Field of Classification Search .............. 136/246, 136/249, 251, 261, 262, 252, 244, 259; 257/433, 257/434, 437, 443
See application file for complete search history.

(56) References Cited

U.S. PATENT DOCUMENTS

| | | | |
|---|---|---|---|
| 4,045,245 | A | 8/1977 | Coleman et al. |
| 4,255,211 | A | 3/1981 | Fraas |
| 4,295,002 | A | 10/1981 | Chappell et al. |
| 4,352,948 | A | 10/1982 | Kaplow et al. |
| 4,461,922 | A | 7/1984 | Gay et al. |
| 4,575,577 | A | 3/1986 | Fraas |
| 4,633,031 | A | 12/1986 | Todorof |
| 5,080,725 | A | 1/1992 | Green et al. |
| 5,081,049 | A | 1/1992 | Green et al. |
| 5,123,968 | A * | 6/1992 | Fraas et al. ............ 136/246 |
| 5,176,758 | A | 1/1993 | Nath et al. |
| 5,527,716 | A | 6/1996 | Kusian et al. |
| 5,986,204 | A | 11/1999 | Iwasaki et al. |

(Continued)

FOREIGN PATENT DOCUMENTS

DE    3109284 A1 *    9/1982

(Continued)

OTHER PUBLICATIONS

Keener et al, "Progress toward technology transition of GaInP2/GaAs/Ge multijunction solar cells," IEEE 26th PVSC, Sep. 30-Oct. 3, 1997, pp. 787-792.*

*Primary Examiner*—Alex Noguerola
(74) *Attorney, Agent, or Firm*—Dorsey & Whitney LLP (57) ABSTRACT

A solar collector (100) is provided having increased efficiency and operating life, and reduced size and cost over conventional collectors. Generally, the collector (100) includes a three-dimensional array (110) of cells (104), including a base-layer (112) and at least one elevated-tier (114) above and separated from the base-layer, so that at least some light passes between cells of the tier to the base-layer. Preferably, the tier (114) includes cells (104) oriented to receive light reflected from the base-layer (112). More preferably, the array (100) is within an enclosure (108) having a bottom-wall (120) and sidewalls (122, 124) that reflect a portion of light incident thereon onto the cells (104). In one embodiment, the cells (104) include types of monolithic cells sensitive to different wavelengths of light, and the collector (100) further includes voltage converters (144) to match voltages from the different types of cells to a common output voltage. Optionally, cells (104) susceptible to damage by ultraviolet radiation are oriented to receive only reflected light.

20 Claims, 10 Drawing Sheets

U.S. PATENT DOCUMENTS

| | | |
|---|---|---|
| 5,994,641 A | 11/1999 | Kardauskas |
| 6,018,123 A | 1/2000 | Takada et al. |
| 6,255,580 B1 | 7/2001 | Karam et al. |
| 6,353,175 B1 | 3/2002 | Fraas |
| 6,410,843 B1 | 6/2002 | Kishi et al. |
| 6,515,217 B1* | 2/2003 | Aylaian ................. 136/246 |
| 2003/0015233 A1* | 1/2003 | Barone ................. 136/246 |
| 2004/0084077 A1* | 5/2004 | Aylaian ................. 136/246 |
| 2005/0166952 A1* | 8/2005 | Ransquin et al. ........ 136/246 |

FOREIGN PATENT DOCUMENTS

| | | |
|---|---|---|
| DE | 3130226 A1 * | 2/1983 |
| WO | WO 03/085745 A1 * | 10/2003 |

* cited by examiner

SOLAR CELL HAVING PHOTOVOLTAIC CELLS INCLINED AT ACUTE ANGLE TO EACH OTHER

TECHNICAL FIELD

The present invention relates generally to solar collectors, and more particularly to a solar collector having a three-dimensional array of different types of monolithic photovoltaic cells enclosed within an enclosure having reflective surfaces to provide improved efficiency, extended operating life and reduced manufacturing cost.

BACKGROUND

Solar or photovoltaic cells (PVCs) are semiconductor devices having P-N junctions which directly convert radiant energy of sunlight into electrical energy. Conversion of sunlight into electrical energy involves three major processes: absorption of sunlight into the semiconductor material; generation and separation of positive and negative charges creating a voltage in the PVC; and collection and transfer of the electrical charges through terminal connected to the semiconductor material. PVCs are widely known and commonly used in a variety applications, including providing electrical energy for satellites and other space craft, marine vessels, installations in areas not served by a grid of an electric utility company, and portable consumer electronics devices such as radios, tape/compact disc players and calculators.

Heretofore PVCs have not been widely used as a main or even auxiliary source of power for residences and businesses having access to conventional power sources, for example, through a power grid of an electric utility company. There are several reasons for this, the most important of which is cost. Electricity produced from solar cells tends to be relatively expensive compared to that available from conventional power sources such as hydroelectric, oil-fired, coal fired and nuclear power plants.

Figure 1:
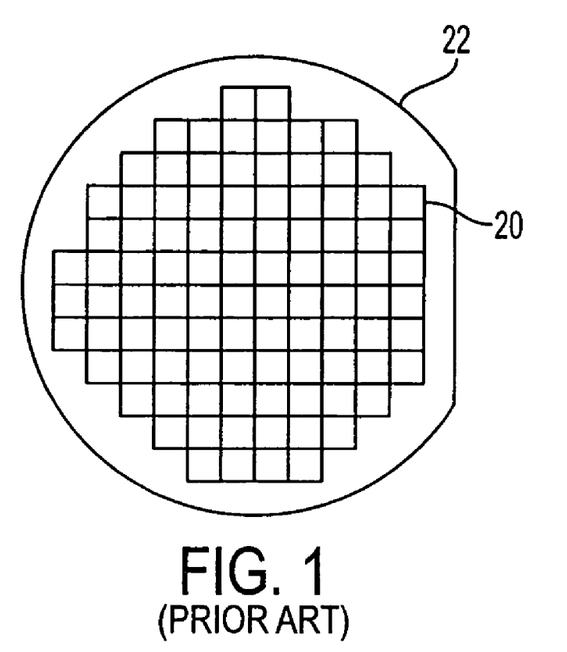
FIG. 1 (Prior Art) is a plan view of a substrate having a plurality of individual photovoltaic cells (PVCs) formed on a surface thereof.

Although the cost of installing, maintaining and repairing solar electric generation arrays or systems is not insignificant, the greatest cost associated with solar energy is the cost of the manufacturing the PVCs. Referring to FIG. 1, prior art PVCs 20 are typically formed on an ultra-pure silicon wafer or substrate 22, which in itself can cost from about 300 hundred to about 5 thousand dollars apiece depending on size. For example, an 8 inch diameter silicon commonly used in manufacturing PVCs typically costs about 2.5 thousand dollars. Furthermore, traditionally a large number of individual PVCs 20 were fabricated on a single substrate 22 by (i) depositing or growing a doped layer of semiconductor material, such as silicon, over the substrate 22 including a dopant of an opposite type; (ii) patterning and etching the substrate 22 with the doped layer thereon to form individual PVCs 20; (iii) depositing a metal layer over the etched substrate 22; (iv) patterning and etching the metal layer to form vias, contacts and lines interconnecting the individual PVCs 20; and (v) inspecting and testing the finished PVCs 20 to remove from an output circuit defective PVCs. The time, equipment and skilled operators required to perform each of the above steps makes the cost of solar electricity extremely expensive, and impractical for just about any use for which an alternative conventional energy source is available.

In an effort to reduce costs, some of the latest generations of PVCs have been monolithic PVCs in which substantially the entire surface of a substrate is taken up by a single large PVC, thereby eliminating much of the time and costs associated with patterning and etching the doped layer and the metal layer. However, this approach has not been wholly successful, since unlike with a substrate having numerous individual PVCs which can be individually removed from the output circuit, a single defect at any point in the monolithic PVC would render the entire substrate useless. In practice, this has resulted in yields well below 40%, offsetting or completely negating any cost savings realized with this approach.

Yet another problem with prior art PVCs is their low external quantum efficiency. By external quantum efficiency it is meant the proportion of the available photons converted into electrical energy. Power from the sun arrives at Earth in the form of photons of light in a wide spectrum from approximately 120 nanometers to 20 micrometers. The total solar irradiance, neglecting absorption in the atmosphere, is approximately 135 $mW/cm^2$ (about 10,000 watts per square meter). Thus, a significant amount of solar radiation is available, but is not absorbed by today's commercially available PVCs. The challenge to photovoltaic manufacturers has always been how to convert this abundance of energy into electricity.

Inefficiency in converting available light into electrical energy is particularly a problem for solar electric systems having limited power generating capability. This is because usable solar energy is available for only a fraction of a day, when it is available the PVCs must generate energy to meet current demands and generate sufficient energy to be stored for use when usable solar energy is unavailable. Thus, conventional solar electric systems must either have relatively large numbers of PVCs, which as explained above are costly, or have a high degree of efficiency. Unfortunately, prior art PVCs are typically only from about 10 to 14% efficient.

Figure 2:
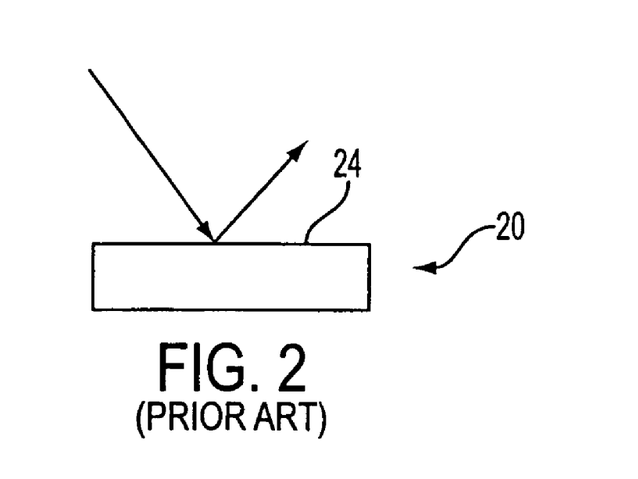
FIG. 2 (Prior Art) is a simplified block diagram of a typical solar cell showing incident light striking active devices on a top surface of the solar cell.

Referring to FIG. 2 it is seen that a major reason for this poor efficiency comes from the reflectance of photons from front and buried surfaces of the PVCs. External Quantum Efficiency is reduced by the reflected photons, which either never enter the cell (front surface reflection) or are reflected from the back surface or metallization layer interfaces and exit the cell without being absorbed. Thus a significant or even a large proportion of the light incident on a surface 24 of the PVC 20 is simply reflected away again.

A more fundamental problem is due to quantum mechanical properties of the semiconductor crystal of the PVCs. Conventional PVCs are capable of utilizing or converting into electricity only a narrow range of light wavelengths corresponding to a band-gap energy of the p-n junction of the PVC, no matter how much light is concentrated or incident thereon. For example, although solar radiation includes wavelengths from $2 \times 10-7$ to $4 \times 10-6$ meters, silicon based PVCs having a band gap energy of about 1.1 electron volts (eV) are capable of utilizing only wavelengths from about $0.3 \times 10-6$ to about $3.0 \times 10-6$ meters. Similarly, gallium-arsenide (GaAs) based PVCs, aluminum-gallium-arsenide (AlGaAs) based PVCs, and germanium (Ge) based PVCs have band gap energies of 1.43, 1.7 and 0.5 eV respectively, and are therefore sensitive to other wavelengths.

Accordingly, there is a need for a solar collector that is inexpensive to fabricate, highly efficient in its utilization of available solar radiation, and which has an extended operational life.

The present invention provides a solution to these and other problems, and offers other advantages over the prior art.

SUMMARY

It is an object of the present invention to provide a solar collector having an array of photovoltaic cells with improved efficiency, extended operating life and reduced manufacturing cost.

According to one aspect of the present invention, the solar collector includes a number of substrates arranged in a two-dimensional array of, each substrate having a monolithic photovoltaic cell (PVC) formed on a surface thereof for converting light incident thereon into electrical energy. The PVCs include at least two different types of PVCs receptive to different wavelengths of light and having different band gap energies. The array of substrates are enclosed within an enclosure having a top-wall with an anti-reflective coating through which light is passed to the PVCs, and bottom and sidewalls having reflective coatings to reflect at least a portion of light incident thereon onto the PVCs. Preferably, the enclosure further includes end-walls joining the top and bottom walls. Like the top-wall, the end-walls also have anti-reflective coatings thereon and join the top-wall at an angle selected to facilitate passage of light to the PVCs from a light source inclined relative to a surface of the top-wall.

In one embodiment, the PVCs include at least two different types of PVCs selected from a group consisting of silicon based PVCs, gallium-arsenide (GaAs) based PVCs, aluminum-gallium-arsenide (AlGaAs) based PVCs, and germanium (Ge) based PVCs. Preferably, where the PVCs include GaAs, AlGaAs or Ge based PVCs, the PVCs include a top passivation layer to filter damaging radiation.

In another embodiment, the solar collector further includes a voltage output circuit or circuit electrically coupling all the PVCs to a single voltage output from the solar collector. Generally, the circuit has a number of voltage converters to match voltages from the different types of PVCs to a common output voltage. The circuit can couple the PVCs in parallel, in series or in a combination of both. In one alternative embodiment, a number of a particular type of PVCs may be connected in series with one another and in parallel with a second number of a second type of PVCs having a different band gap energy to provide a common output voltage. For example, the solar collector can include 15 AlGaAs based PVCs having a band gap energy of 1.7 electron volts (eV), 18 GaAs based PVCs having a band gap energy of 1.4 eV, and 23 silicon based PVCs having a band gap energy of 1.1 eV to provide a common output voltage of about 25 volts direct current (vdc).

In another aspect the present invention is directed to a solar collector having a number of substrates arranged a three-dimensional array. Each substrate has at least one PVC formed on a surface thereof for converting light incident thereon into electrical energy. The three-dimensional array includes a lower or base-layer of substrates, and at least one elevated-tier of substrates positioned above and separated from the base-layer of substrates, so that at least a portion of the light passes between the substrates of the elevated-tier and is absorbed by the substrates of the base-layer.

In one embodiment, the elevated-tier includes substrates having surfaces with the PVCs formed thereon oriented to receive at least some of the light reflected from the substrates of the base-layer. Preferably, the PVCs are monolithic PVCs, and include at least two different types of monolithic PVCs selected from a group consisting of silicon, GaAs, AlGaAs, and Ge based PVCs. More preferably, the where the PVCs include GaAs, AlGaAs or Ge based PVCs, these PVCs are oriented to receive only light reflected from the substrates of the base-layer, thereby reducing their exposure to damaging levels of short wavelength or ultraviolet radiation. Optionally, the GaAs, AlGaAs and Ge based PVCs include a top passivation layer to filter-out or further reduce their exposure to damaging radiation.

In yet another aspect the present invention is directed to a solar collector including a three-dimensional array of substrates enclosed within an enclosure having a top-wall with an anti-reflective coating through which light is passed to the PVCs, and bottom and sidewalls having reflective coatings to reflect at least a portion of light incident thereon onto the PVCs. As above, each substrate has a PVC formed on a surface thereof, and the three-dimensional array includes a base-layer of substrates, and at least one elevated-tier of substrates positioned above and separated from the base-layer of substrates, so that at least a portion of the light passes between the substrates of the elevated-tier and is absorbed by the substrates of the base-layer.

In a preferred embodiment, the enclosure further includes end-walls joining the top and bottom walls, and the substrates of the elevated-tier are electrically coupled to and supported above the base-layer by a ground conductor affixed at both ends thereof to either the end-walls or the sidewalls of the enclosure. The ground conductor can include one or more wires or straps. Optionally, the substrates of the elevated-tier can be further supported by voltage conductors affixed the substrates and to the enclosure.

In one embodiment, the elevated-tier includes substrates having surfaces with the PVCs formed thereon oriented to receive at least a portion of light reflected from the substrates of the base-layer and/or from the bottom-wall of the enclosure. It will be understood that the solar collector can include multiple elevated-tiers, each having substrates on a top portion thereof and on a bottom portion thereof. The substrates on the top portion are oriented to receive light directly through the top-wall of the enclosure and light reflected from substrates on the bottom portion of an overlying tier. The substrates on the bottom portion of the elevated-tiers are oriented to receive light reflected from either substrates on the top portion of an underlying tier, the bottom layer of substrates, or the sidewalls and bottom-wall of the enclosure. Preferably, the elevated-tiers are offset from one another such that at some portion of the substrates of each elevated-tier and the bottom layer receive at least some light passed directly through the enclosure and onto the substrates.

In another embodiment, the PVCs include at least two different types of monolithic PVCs selected from a group consisting of silicon, GaAs, AlGaAs, and Ge based PVCs. Where the PVCs include GaAs, AlGaAs or Ge based PVCs, these PVCs are oriented to receive only light reflected from the substrates of the base-layer, thereby reducing their exposure to damaging levels of short wavelength or ultraviolet radiation. Optionally, the GaAs, AlGaAs and Ge based PVCs include a top passivation layer to filter-out or further reduce damaging radiation.

Generally, the solar collector further includes a circuit electrically coupling the PVCs to a voltage output from the solar collector, the circuit including a number of voltage converters to match voltages from the different types of PVCs to a common output voltage.

In yet another embodiment, the solar collector further includes a cooling mechanism selected from the group consisting of: (i) a number of vents in the enclosure to enable movement of air therethrough; (ii) vents in the enclosure and a fan to facilitate movement of air through the enclosure, the fan powered by at least a part of the voltage output from the PVCs; and (iii) a heat exchanger thermally coupled to at least some of the substrates and/or the enclosure, the heat exchanger including one or more passages or tubes through which a fluid is passed to cool the solar collector. In one preferred version of this embodiment, the heat exchanger is adapted to provide heat or heated water, in particular potable water, to a residence or business.

In still another aspect the present invention is directed to a solar collector including a three-dimensional array of substrates each having a photovoltaic cell (PVC) formed on a surface thereof for converting light incident thereon into electrical energy. Generally, the three-dimensional array includs a base-layer of substrates, and a first elevated-tier of substrates positioned above and separated from the base-layer of substrates, and the surfaces of the base-layer of substrates are oriented at an angle relative to the light incident thereon to reflect light received thereon to the substrates of the first elevated-tier of substrates. Preferably, the surface of a first substrate of the first elevated-tier of substrates is oriented at an acute angle relative to the surfaces of the base-layer of substrates to receive light reflected from the substrates of the base-layer, and to reflect light onto the surface of a second substrate of the first elevated-tier of substrates. Alternatively, a first substrate of the first elevated-tier of substrates is oriented to reflect light received from the substrates of the base-layer onto the surface of a substrate in a second elevated-tier of substrates positioned above and separated from the first elevated-tier of substrates.

In another aspect the present invention is directed to a solar collector having an enclosure enclosing an array of substrates, each substrate having a monolithic PVC formed on a surface thereof for converting light incident thereon into electrical energy, the enclosure including a top-wall with a concentrator through which light is passed to a base-layer of substrates.

Advantages of the solar collector of the present invention include any one or all of the following:

(i) an improved efficiency of up to 3 times that of similarly sized conventional solar collectors;

(ii) reduced size or 'footprint' as compared to conventional solar collectors with a similar power output, thereby simplifying an installation process and enabling use of the inventive solar collector in locations having a limited area available for a solar cell;

(iii) extended operating life made possible by reducing exposure of sensitive PVCs to damaging levels of short wavelength or ultraviolet radiation, and by actively cooling the solar collector to maintain the PVCs below a maximum desirable operating temperature;

(iv) ability to use fluid from a heat exchanger used to cool the solar collector to provide heat or heated water to a residence or business;

(v) reduced manufacturing or fabrication cost made possible by use of monolithic PVCs thereby eliminating the need to form and interconnect multiple PVCs on a single substrate; and (vi) reduced manufacturing time achieved by eliminating the need to form and interconnect multiple PVCs on a single substrate.

BRIEF DESCRIPTION OF THE DRAWINGS

These and various other features and advantages of the present invention will be apparent upon reading of the following detailed description in conjunction with the accompanying drawings, where.

DETAILED DESCRIPTION

The present invention is directed to an improved solar collector having an array of substrates, each with at least one photovoltaic cell (PVC) formed on a surface thereof for converting light incident thereon into electrical energy.

Figure 3A:
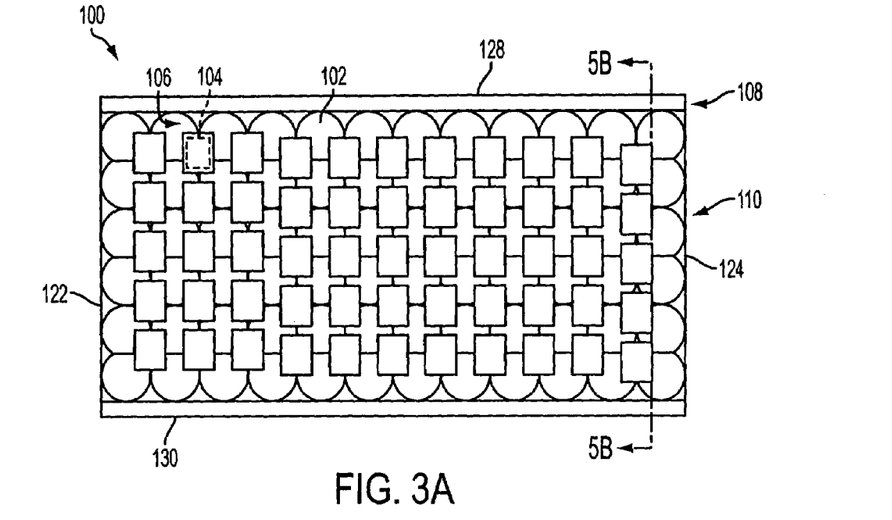
FIG. 3A is a plan view of a solar collector with a plurality of substrates, each with a PVC formed thereon, enclosed within a reflective enclosure and arranged in a three-dimensional array having a single elevated-tier of substrates according to an embodiment of the present invention.

A solar collector 100 according to the present invention will now be described with reference to FIGS. 3A and 3B. FIG. 3A is a plan view of a solar collector 100 including a number of wafers or substrates 102, each with at least one PVC 104 formed on a surface 106 thereof for converting light incident thereon into electrical energy. The PVCs 104 can include a number of individual discrete PVCs formed on a single substrate 102, or a single monolithic PVC formed on a single substrate. Generally, the substrates 102 are enclosed within a reflective enclosure or an enclosure 108 according to an embodiment of the present invention. For purposes of clarity, many of the details of solar collectors 100 that are widely known and are not relevant to the present invention have been omitted. Referring to FIG. 3A, the substrates 102 of the solar collector 100 are ordered or arranged in a grid or an array 110 including a lower-tier or a base-layer 112 of substrates 102 electrically interconnected or coupled by a common ground conductor and/or common voltage outputs (not shown in this figure).

Preferably, the array 110 is a three-dimensional array including at least one elevated-tier 114 of substrates 102 positioned above and separated from the base-layer of substrates, such that at least a portion of the light passing between the substrates of the elevated-tier is absorbed by the substrates of the base-layer, thereby increasing the utilization of all light falling on the solar collector and improving its' overall efficiency. More preferably, referring to FIG. 3B, the enclosure 108 enclosing the array 110 of substrates 102, includes a top-wall 116 with an anti-reflective coating or surface 118 through which light is passed to the PVCs 104, and a bottom-wall 120 and sidewalls 122, 124, with reflective coatings or surfaces 126 to reflect light incident thereon back to the PVCs.

Generally, the enclosure 108 further comprises end-walls 128, 130, joining the top-wall 116 and bottom-wall 120. The end-walls 128, 130, also typically include anti-reflective coatings or surfaces 118, and join the top-wall 116 at an angle selected to facilitate passage of light to the PVCs 104 from a light source (not shown) inclined relative to the surface of the top-wall. Preferably, each of the end-walls 128, 130, form an angle of from about 50 to about 75 degrees with the surface of the top-wall 116, and an angle of from about 105 to about 130 degrees with the bottom-wall 120. More preferably, the end-walls 128, 130, form an angle of about 60 degrees with the top-wall 116, and an angle of about 120 degrees with the bottom-wall 120. Angling of the end-walls 128, 130, is particularly desirable to enable a solar collector 100 located, installed or positioned in a substantially horizontal position to catch the rays of the rising or setting sun.

Figure 3B:
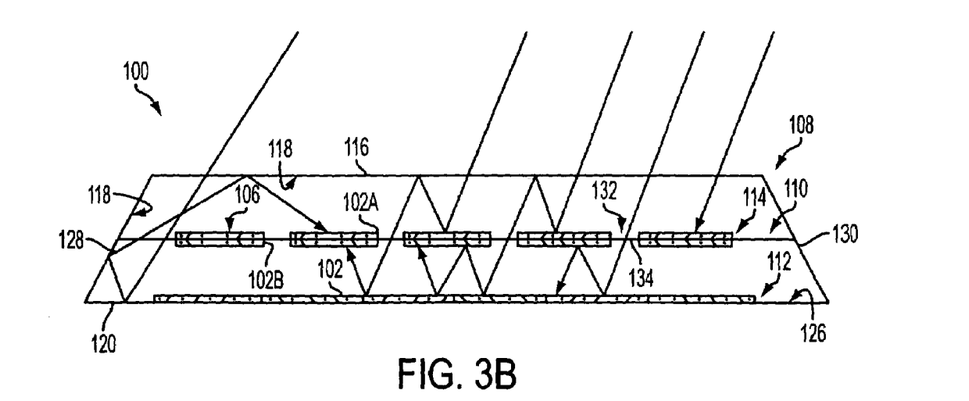
FIG. 3B is a side view of the solar collector of FIG. 3A showing the position of the substrates of the elevated-tier relative to a base-layer, and the reflection of light among the plurality of substrates according to an embodiment of the present invention.

In one embodiment, shown in FIG. 3B, the elevated-tier 114 includes substrates 102 having surfaces 106 on which the PVCs 104 are formed oriented to receive light reflected from substrates of the base-layer 112. As also shown, the substrates 102 of the elevated-tier 114 can be suspended above the base-layer 112 by a support 132, such as a cord, strip, wire or wires, fastened or affixed to either the end-walls 128, 130, or sidewalls 122, 124, of the enclosure 108. Alternatively, the support 132 can be affixed to support pylons or structures (not shown) within the enclosure 108. Preferably, the support 132 is a ground-conductor 134, for example a metal strip, wire or wires, to which each of the substrates 102 are electrically coupled. More preferably, the substrates 102 of the elevated-tier 114 are arranged in regularly spaced columns extending from end-wall 128 to end-wall 130 of the enclosure 108 and in rows extending from sidewall 122 to sidewall 124, and the support 132 includes a number of ground-conductors 134 extending between the end-walls to support each column of substrates. Generally, the ground-conductors 134 are joined and electrically coupled to a bus-bar or ground strip (not shown in these figures) bonded or otherwise affixed to an inner surface of the end-walls 128, 130.

Figure 4A:
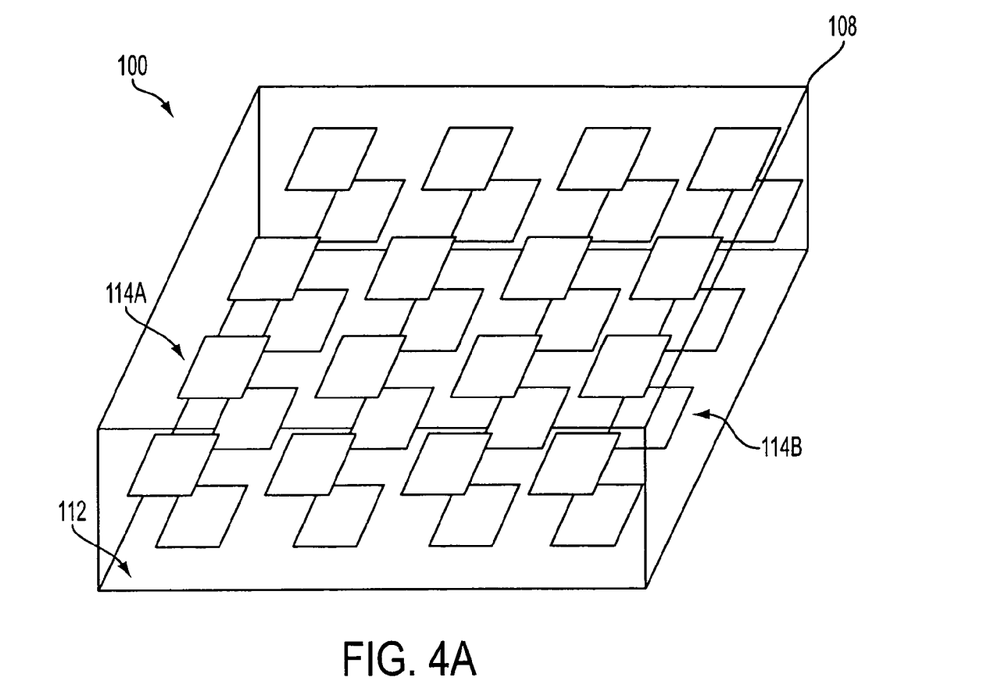
FIG. 4A is a perspective view of a solar collector with a plurality of substrates, each with a PVC formed thereon, enclosed within a reflective enclosure and arranged in a three-dimensional array having multiple elevated-tier of substrates according to an embodiment of the present invention.
Figure 4B:
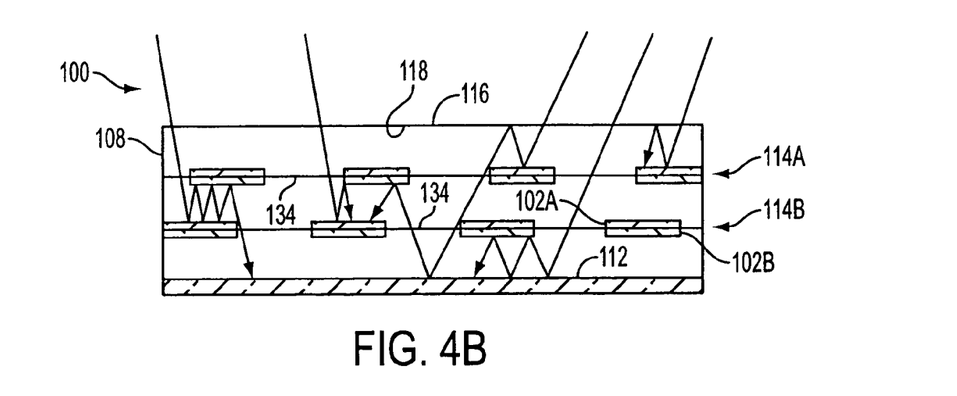
FIG. 4B is a side view of the solar collector of FIG. 4A showing the position of the substrates of the elevated-tiers relative to a base-layer, and the reflection of light among the plurality of substrates according to an embodiment of the present invention.

In another embodiment, shown in FIGS. 4A and 4B, the solar collector 100 includes multiple elevated-tiers 114 including an upper or top elevated-tier 114A and a lower or bottom elevated-tier 114B. Each of the multiple elevated-tiers 114A, 114B, having upward facing substrates 102A on a top half or portion thereof and downward facing substrates 102B on a bottom half or portion thereof. The upward facing substrates 102A on the top portions are oriented to receive light directly through the top-wall 116 of the enclosure 108 and, in the case of the bottom elevated-tier 114B, also to receive light reflected from downward facing substrates 102B on the bottom portion of overlying top elevated-tier 114A. The downward facing substrates 102B on the bottom portions of the elevated-tiers 114A, 114B, are oriented to receive either light reflected from upward facing substrates 102A on the top portion of an underlying elevated-tier, light reflected from the bottom-layer of substrates, or light reflected from the sidewalls 122, 124, and bottom-wall 120 of the enclosure 108. Preferably, the elevated-tiers 114A, 114B, are offset from one another such that at least some portion of the substrates 102 of each elevated-tier and of the bottom-layer 112 receive at least some light passed directly through the top-wall 116 of the enclosure 108.

Figure 5:
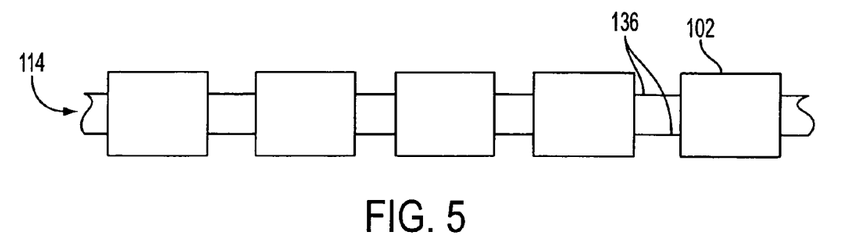
FIG. 5 is a top view of an elevated-tier of substrates in a solar collector showing use of a common ground wire(s) to support and interconnect the substrates of the elevated-tier according to an embodiment of the present invention.

FIG. 5 is a top view of a portion or column of an elevated-tier 114 of substrates 102 in a solar collector showing use of a pair of ground wires 136 to support and interconnect the substrates thereof according to an embodiment of the present invention.

Figure 6:
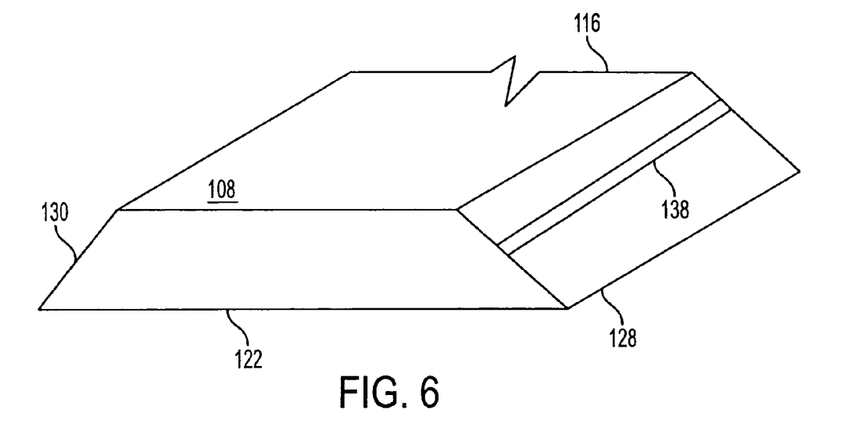
FIG. 6 is a partial perspective view of an enclosure showing an attachment of ground wires supporting elevated-tiers to the enclosure according to an embodiment of the present invention.

FIG. 6 is a partial perspective view of the enclosure 108 showing a ground strip 138 attached, bonded or otherwise affixed to the inner surface of the end-walls 128, 130, and to which the air of ground wires 136 supporting the substrates 102 of the elevated-tiers 114 are physically and electrically coupled.

Figure 7:
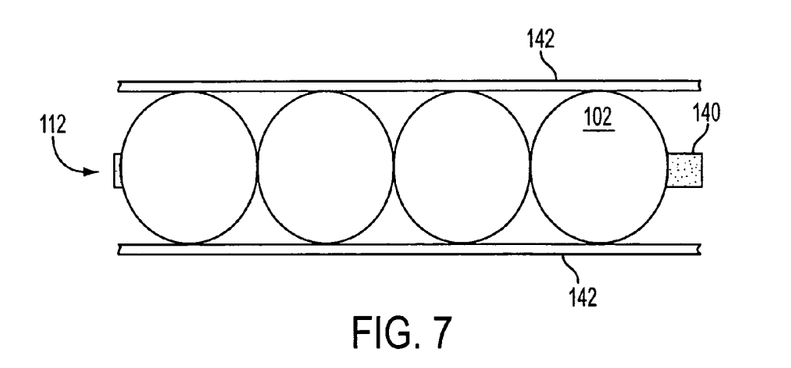
FIG. 7 is a partial top view of a bottom layer of PVCs showing orientation of wafers or substrates within a row and interconnection of a common ground wire, and voltage output strips according to an embodiment of the present invention.

Generally, the substrates 102 of the base-layer 112 of the array are also arranged in columns and/or rows. For example, in one embodiment the substrates are arranged in a number of columns extending from end-wall 128 to end-wall 130 of the enclosure 108. FIG. 7 is a partial top view of such a column showing orientation of alternating pairs of substrates 102 along large flats of the 1,1,1, crystal face. FIG. 7 also shows interconnection of the substrates 102 by a common ground strip 140 and by voltage output strips or wires 142 electrically coupling the substrates together in parallel according to an embodiment of the present invention.

In yet another embodiment, the PVCs 104 include a number of different types of PVCs each sensitive to a different range of wavelengths of light and each having different band gap energy. Preferably, the PVCs 104 include at least two different types of PVCs selected from a group consisting of silicon based PVCs, gallium-arsenide (GaAs) based PVCs, aluminum-gallium-arsenide (AlGaAs) based PVCs, and germanium (Ge) based PVCs. More preferably, where the PVCs 104 include GaAs, AlGaAs or Ge based PVCs, which can be damaged by exposure to high levels of short wavelength or ultraviolet radiation, each substrate 102 has only a single type of PVC formed thereon, and the substrates having GaAs, AlGaAs or Ge based PVCs, are positioned and oriented within the array 110 to receive substantially only light reflected from the sidewalls 122, 124, bottom-wall 120, or other substrates, such substrates of the base-layer 112 or upward facing substrates 102A on the top portion of an underlying elevated-tier 114. Because the reflected light is of lower overall intensity, and because certain wavelengths of light are completely or substantially absorbed by the surfaces which they first strike, the damaging radiation reflected onto the GaAs, AlGaAs or Ge based PVCs is reduced. Optionally, the GaAs, AlGaAs or Ge based PVCs 104 include a top passivation layer of oxide or nitride to filter out or remove damaging radiation further reducing the possibility or incidence of damage.

Figure 8:
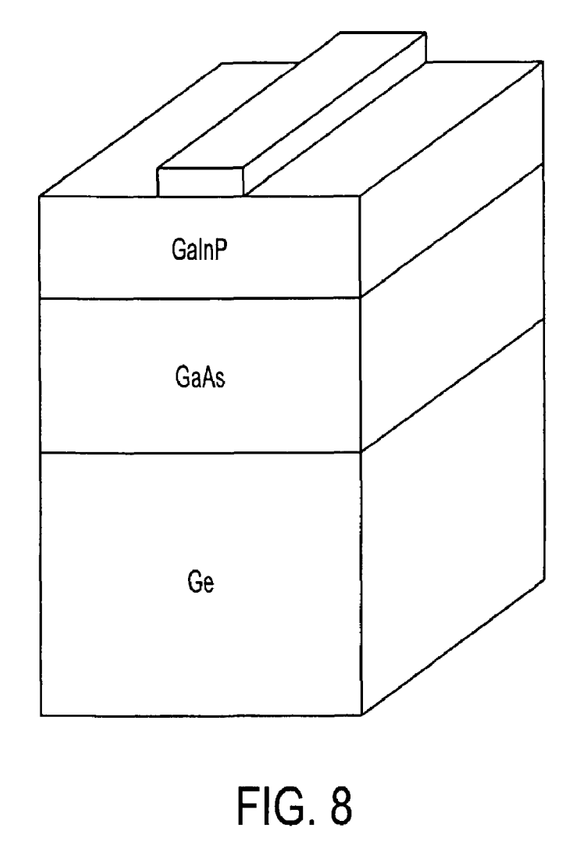
FIG. 8 is a sectional side view of a PVC having a plurality of layers, each sensitive to a different wavelength of light and each having a different band gap energy to enhance collection of incident light, which is particularly suitable for use in a solar collector according to an embodiment of the present invention.
Figure 9:
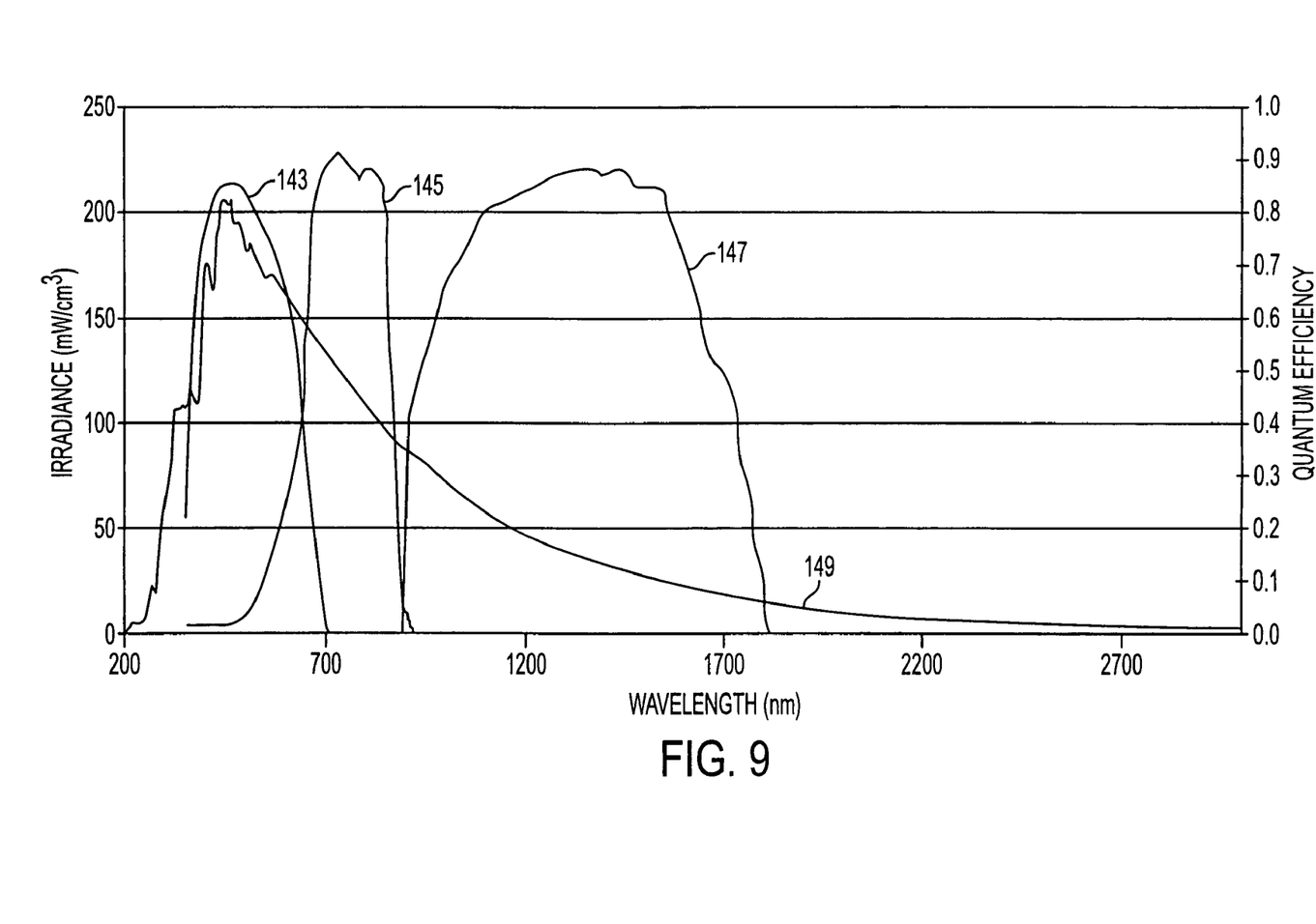
FIG. 9 is a graph of external quantum efficiency versus wavelength for a triple junction PVC.

In still another embodiment, shown in FIG. 8, the PVCs 104 include monolithically grown devices having multiple layers or junctions, each sensitive to a different range of wavelengths of light and each having different band gap energy. FIG. 8 illustrates an example of a PVC 104 having a highly efficient triple junction cell structure. Referring to FIG. 8, a top gallium Indium-Phosphide (GaInP) layer absorbs short wavelength, high-energy photons, while successive gallium-arsenide (GaAs) and Ge layers absorb longer wavelength energy. As shown in the graph of FIG. 9, the total efficiency of the cell is thus greatly improved. FIG. 9 is a graph of external quantum efficiency versus wavelength for a triple junction PVC. It has been found that triple junction PVCs 104 can absorb photons in the range from 350 nanometers to 1800 nanometers, with an efficiency of greater than 87% of the total available solar spectral irradiance. Referring to FIG. 9, the external quantum efficiency of the GaInP layer is represented by the line identified by reference numeral 143; the external quantum efficiency of the GaAs layer is represented by the line identified by reference numeral 145; and the external quantum efficiency of the Ge layer is represented by the line identified by reference numeral 147. The line identified by reference numeral 149 represents the average Spectral irradiance in mW/cm$^2$.

Figure 10:
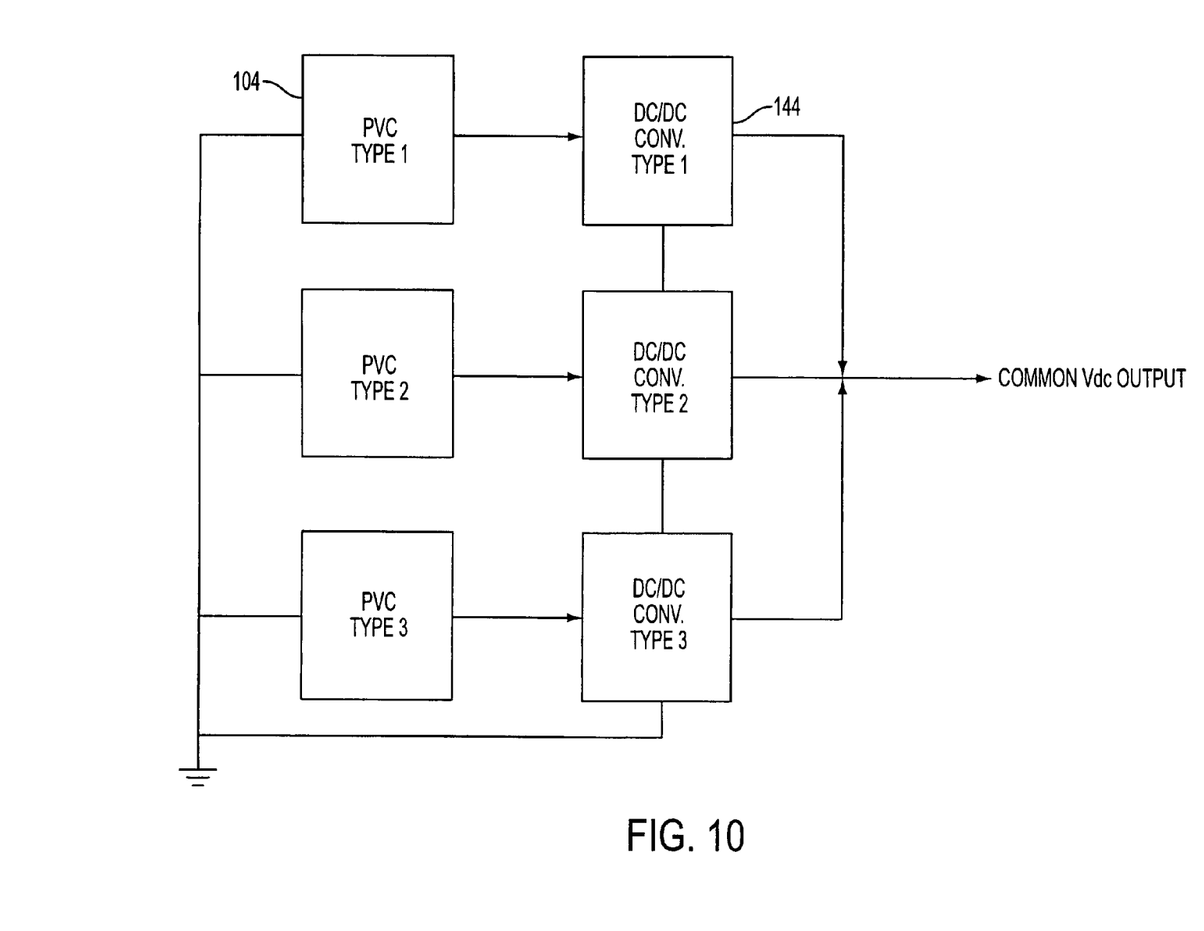
FIG. 10 is a simplified schematic diagram showing a scheme for electrical connection of PVCs adapted to utilize different wavelengths of light according to an embodiment of the present invention.

FIG. 10 is a simplified schematic diagram showing a scheme for electrical connection of PVCs 104 adapted to utilize different wavelengths of light according to an embodiment of the present invention. Referring to FIG. 10, in a preferred embodiment each of the different types of PVCs 104, shown here as types 1, 2 and 3, are connected to a different DC to DC voltage converter or converter 144 within the enclosure 108 of the solar-collector 100. Each of the different types of PVCs 104 are connected in parallel to a single converter 144, and outputs of the converters are connected in parallel to provide a common vdc output. The converters 144 raise or lower the voltage provided from the different types of PVCs 104 to match a voltage from another type of PVCs or of the common output voltage. The number of converters 144 in the solar-collector 100 depends on the number of different types of PVCs 104 contained therein, and generally is equal to or one less than the number of different types of PVCs. The value of the common output voltage can be chosen based power transport efficiency, requirements of external elements, such as batteries charged by the solar-collector or an inverter circuit for providing alternating current (AC) to a business or residence, or to match the output of one of the types of PVCs 104.

Figure 11A:
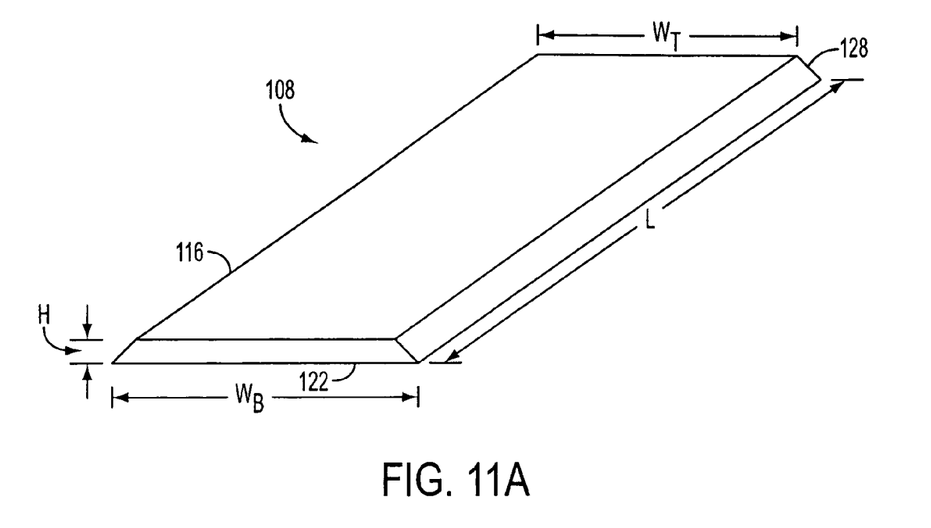
FIG. 11A is a perspective view of an enclosure for a solar collector according to an embodiment of the present invention.

FIG. 11A is a perspective view of the enclosure 108 for the solar collector 100 according to an embodiment of the present invention. As shown the enclosure has a length (L) along the end-walls 128, 130, much greater than a width ($W_T$, $W_B$) associated with sidewalls 122, 124. The overall height (H) of the enclosure 108 is dependent on the number of elevated-tiers 114, the spacing therebetween, and size of a cooling mechanism (not shown in this figure) if any enclosed therein.

Figure 11B:
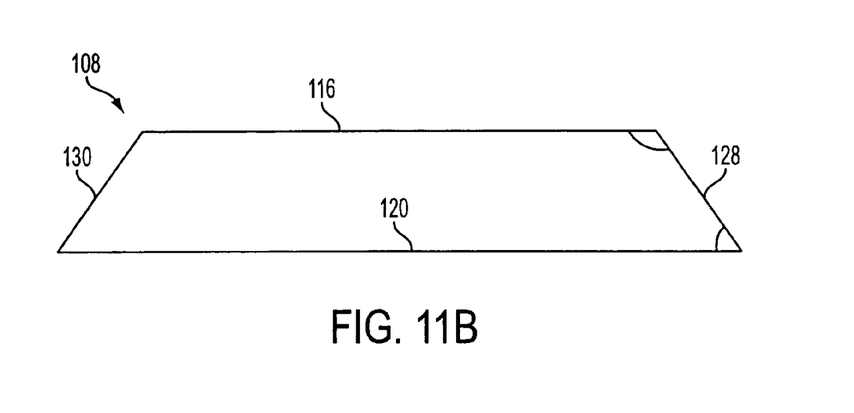
FIG. 11B is a side view of the enclosure of FIG. 11A according to an embodiment of the present invention.

Preferably, the solar collector 100 is oriented so that the sun travels in an arc across the width of the enclosure 108, thereby maximizing the exposure of the substrates 102 with the PVCs 104 thereon to light passing through the end-walls 128, 130, when the sun is at a relatively low inclinations or elevations. For example, at or near sunrise and sunset. FIG. 11B is a side view of the enclosure 108 of FIG. 11A illustrating the angles with which the end-walls 128, 130, join the top-wall 116 and bottom-wall 120.

Figure 12:
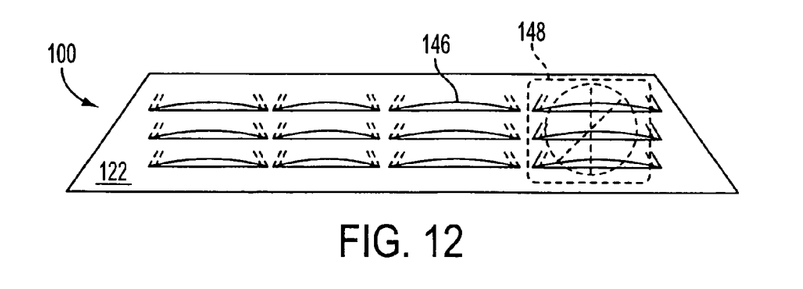
FIG. 12 is a side view of an enclosure for a solar collector showing cooling vents according to an embodiment of the present invention.

FIG. 12 is a side view of an enclosure 108 for the solar collector 100 showing a sidewall 122 having cooling vents 146 formed therein according to an embodiment of the present invention. Alternatively, the cooling vents 146 can be formed in the end-walls 128, 130, in the bottom-wall 120 or in a combination of the sidewalls 122, 134, end-walls, and bottom-wall. The cooling vents 146 enable heated air that would otherwise be trapped inside the enclosure 108 to escape. Preferably, both sidewalls 122, 124, have cooling vents 146 formed therein to enable air to circulate and pass through the enclosure 108. More preferably, the cooling vents 146 are sized, shaped and located to enable the substrates to be maintained at or below a temperature of 150° F. This temperature is the maximum steady state temperature that can be tolerated by PVCs 104 formed on silicon substrates without resulting in diffusion or migration of dopant materials out of the active layer, which can destroy or detrimentally effect the operation of the PVC.

In one version of this embodiment, the cooling mechanism includes, in addition to the cooling-vents 146, a number of fans 148, such as a box fan (only one of which is shown in phantom in FIG. 12), located inside the enclosure 108 to facilitate movement of air there through. Preferably, the fan 148 is electric and powered by at least portion of the output of one or more of the PVCs 104. The fan 148 may be directly wired to one or more PVCs 104 such that the output of the PVCs is solely dedicated to operating the fan, or the fan may be wired to draw off a portion of the output of the solar-collector 100. More preferably, the fan 148 draws power from the solar-collector 100 and is controlled by a thermostat (not shown) so that it is operated only as necessary to maintain the temperature in the enclosure 108 below a desired maximum temperature, thereby increasing efficiency of the solar-collector.

Figure 13:
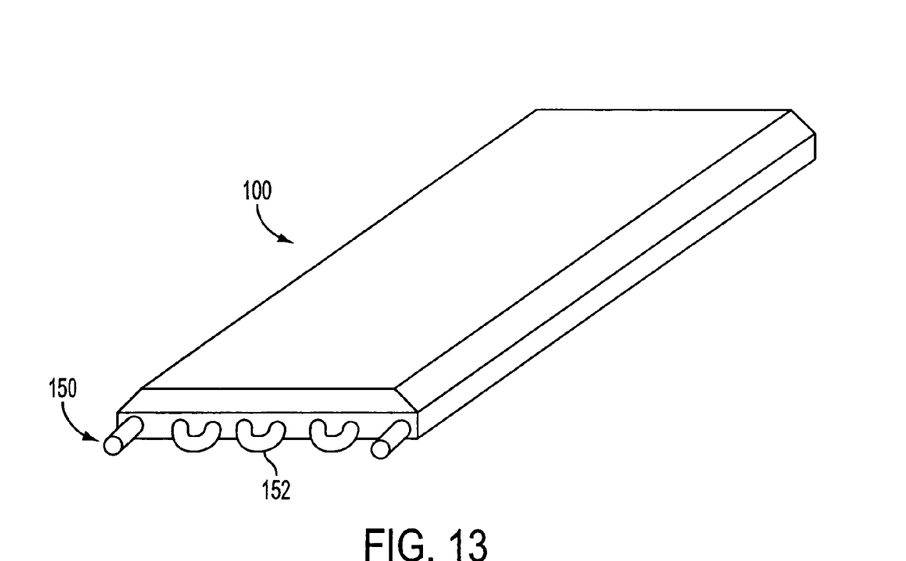
FIG. 13 is a perspective view of an enclosure for a solar collector showing a heat exchanger for cooling substrates of the solar collector according to an embodiment of the present invention.

In another embodiment, the cooling mechanism consists of or further includes a heat exchanger 150 built into or thermally coupled to the bottom-wall 120 of the enclosure 108 for cooling substrates 102 of the solar-collector 100. A perspective view of this embodiment is shown in FIG. 13. Referring to FIG. 13, the heat exchanger 150 generally includes one or more passages or tubes 152 through which a heat transfer fluid, such as a liquid or a gas, is passed to cool the solar-collector 100. In one preferred version of this embodiment, the heat transfer fluid is potable water that is circulated through a large tank or reservoir (not shown) located near the solar-collector 100 to provide heated water to a residence or business. Alternatively, the heat transfer fluid can be circulated through a second heat exchanger (not shown) over which air is forced to provide heat to the residence or business.

Figure 14:
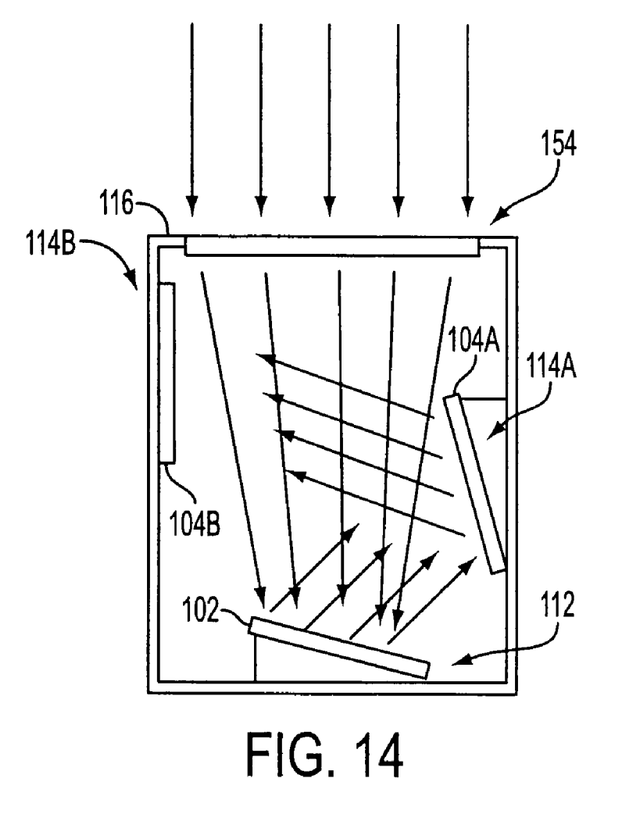
FIG. 14 is a side view of an alternative embodiment of a solar collector having a concentrator to increase efficiency showing the orientation of the substrates of the elevated-tiers relative to a base-layer, and the reflection of light among the plurality of substrates according to the present invention according the present invention.

In yet another alternative embodiment, the solar collector 104 can further include a concentrator 154, such as a lens, to enhance collection of incident light, as shown in FIG. 14. In the embodiment shown in FIG. 14, the top-wall 116 includes or has been replaced by a Fresnel lens to focus or concentrate incident light onto substrates 102 of the base-layer 112. A Fresnel is a lens having a surface of stepped concentric circles, resulting in a shape that is thinner and flatter than a conventional parabolic lens of equivalent focal length.

In still another alternative embodiment, the surfaces of PVCs 104 of the elevated-tiers 114 are positioned and oriented at an angle relative to the surface of PVCs of the base-layer 112 to produce multiple reflections of light reflected from the base layer. In the example shown in FIG. 14 light reflected from the base layer 112 is reflected to surfaces of PVCs 104A in a first elevated-tier 114A positioned at an acute angle thereto, and from the first elevated-tier to other PVCs with the same tier or to PVCs 104B in a second elevated tier 114B. This embodiment has the advantages of enabling substantially all of the light reflecting from the base-layer 112 to be reflected to the elevated-tiers 114 and be absorbed without providing a reflective surface on the enclosure.

In a preferred version of the above embodiment, the types of PVCs 104 in the base-layer 112 and elevated-tiers 114 include multiple layer or junction devices, such as the triple junction PVC 104 shown in FIG. 8 above. More preferably, the PVCs 104 in the elevated-tiers 114 include GaAs, AlGaAs, Ge or Si based PVCs, and are positioned and oriented to receive substantially only reflected light. As explained above, GaAs, AlGaAs, Ge or Si based PVCs have high efficiencies at longer wavelengths, but can be damaged by exposure to high levels of short wavelength or ultraviolet radiation. Because the reflected light is of lower overall intensity, and because certain wavelengths of light are completely or substantially absorbed by the PVCs 104 which they first strike, the damaging radiation reflected onto the GaAs, AlGaAs, Ge or Si based PVCs is significantly reduced.

The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

What is claimed is:

1. A solar collector comprising a support structure having a cavity and an opening for permitting light to enter the cavity, first and second photovoltaic cells carried by the support structure and disposed within the cavity, the second photovoltaic cell being adjacent the first photovoltaic cell, the first photovoltaic cell being disposed within the cavity to receive light entering the cavity and inclined at an acute angle to the second photovoltaic cell for reflecting received light onto the second photovoltaic cell.

2. The solar collector of claim 1 further comprising a third photovoltaic cell carried by the support structure and disposed within the cavity, the third photovoltaic cell being adjacent the first photovoltaic cell and opposing the second photovoltaic cell for receiving light reflected from the second photovoltaic cell.

3. The solar collector of claim 2 wherein the third photovoltaic cell is inclined at an obtuse angle relative to the first photovoltaic cell.

4. The solar collector of claim 1 wherein the first photovoltaic cell is disposed in the cavity opposite the opening.

5. The solar collector of claim 4 wherein the second photovoltaic cell is disposed in the cavity between the opening and first photovoltaic cell.

6. The solar collector of claim 1 wherein the first and second photovoltaic cells are each single monolithic photovoltaic cells.

7. The solar collector of claim 1 wherein the first and second photovoltaic cells are at least two different types of photovoltaic cells selected from the group consisting of silicon based photovoltaic cells, gallium-arsenide based photovoltaic cells, aluminum-gallium-arsenide based photovoltaic cells, germanium based photovoltaic cells and gallium indium-phosphide based photovoltaic cells.

8. The solar collector of claim 1 wherein at least one of the first and second photovoltaic cells is a multiple-junction photovoltaic cell.

9. The solar collector of claim 1 wherein at least one of the first and second photovoltaic cells is a triple-junction photovoltaic cell.

10. The solar collector of claim 1 wherein the support structure is an enclosure having the cavity and the opening for permitting light to enter the cavity.

11. The solar collector of claim 1 further comprising a concentrator disposed in the opening for concentrating the light onto the first photovoltaic cell.

12. The solar collector of claim 1 wherein the support structure is free of light-blocking elements between the opening and the first photovoltaic cell.

13. A solar collector comprising a support structure having a cavity and an opening for permitting light to enter the cavity, first and second photovoltaic cells carried by the support structure and disposed within the cavity, the support structure being free of light-blocking elements between the opening and the first photovoltaic cell, the first photovoltaic cell being disposed within the cavity to receive light entering the cavity and inclined at an acute angle to the second photovoltaic cell for reflecting received light onto the second photovoltaic cell.

14. The solar collector of claim 13 further comprising a third photovoltaic cell carried by the support structure and disposed within the cavity, the third photovoltaic cell being adjacent the first photovoltaic cell and opposing the second photovoltaic cell for receiving light reflected from the second photovoltaic cell.

15. The solar collector of claim 14 wherein the third photovoltaic cell is inclined at an obtuse angle relative to the first photovoltaic cell.

16. The solar collector of claim 13 wherein the first and second photovoltaic cells are each single monolithic photovoltaic cells.

17. The solar collector of claim 13 wherein the first and second photovoltaic cells are at least two different types of photovoltaic cells selected from the group consisting of silicon based photovoltaic cells, gallium-arsenide based photovoltaic cells, aluminum-gallium-arsenide based photovoltaic cells, germanium based photovoltaic cells and gallium indium-phosphide based photovoltaic cells.

18. The solar collector of claim 13 wherein at least one of the first and second photovoltaic cells is a multiple-junction photovoltaic cell.

19. The solar collector of claim 13 wherein at least one of the first and second photovoltaic cells is a triple-junction photovoltaic cell.

20. The solar collector of claim 13 wherein the support structure is an enclosure having the cavity and the opening for permitting light to enter the cavity.

* * * * *